United States Patent
Viana et al.

(10) Patent No.: US 10,719,639 B2
(45) Date of Patent: Jul. 21, 2020

(54) MASSIVELY ACCELERATED BAYESIAN MACHINE

(71) Applicant: General Electric Company, Schenectady, NY (US)

(72) Inventors: Felipe Antonio Chegury Viana, Niskayuna, NY (US); Arun Karthi Subramaniyan, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 732 days.

(21) Appl. No.: 15/401,746

(22) Filed: Jan. 9, 2017

(65) Prior Publication Data

US 2018/0196892 A1    Jul. 12, 2018

(51) Int. Cl.
    *G06N 7/00*      (2006.01)
    *G06F 30/20*      (2020.01)

(52) U.S. Cl.
    CPC ............. *G06F 30/20* (2020.01); *G06N 7/005* (2013.01)

(58) Field of Classification Search
    CPC ...... G06F 17/5009; G06F 30/20; G06N 7/005
    USPC .......................................................... 703/2
    See application file for complete search history.

(56) References Cited

U.S. PATENT DOCUMENTS

| | | | |
|---|---|---|---|
| 6,182,058 B1 * | 1/2001 | Kohavi | G06K 9/6282 706/20 |
| 6,532,305 B1 | 3/2003 | Hammen | |
| 8,234,233 B2 | 7/2012 | Zhou | |
| 8,423,482 B2 | 4/2013 | Gansner | |
| 8,600,830 B2 | 12/2013 | Hoffberg | |
| 2004/0199484 A1 | 10/2004 | Smith et al. | |
| 2005/0246307 A1 * | 11/2005 | Bala | G06N 7/005 706/52 |
| 2012/0259807 A1 * | 10/2012 | Dymetman | G06F 17/18 706/50 |
| 2012/0317065 A1 * | 12/2012 | Bernstein | G06N 7/005 706/46 |

(Continued)

OTHER PUBLICATIONS

Max Henrion, "Propagating uncertainty in Bayesian networks by probabilistic logic sampling", 1988, Machine Intelligence and Pattern Recognition. vol. 5. North-Holland, pp. 149-163.*

(Continued)

*Primary Examiner* — Juan C Ochoa
(74) *Attorney, Agent, or Firm* — Buckley, Maschoff & Talwalkar LLC

(57) ABSTRACT

According to some embodiments, system and methods are provided comprising: receiving data; providing a simulation model for the data; generating one or more simulations via a Bayesian module based on the data, wherein the simulation includes one or more nodes in a chain; executing the Bayesian module to determine the acceptability of the nodes in the simulation based on a Bayesian rule, wherein execution of the Bayesian module further comprises: generating a binary decision tree representing the chain in the simulation, wherein the chain includes one or more nodes; prioritizing which nodes in the tree to simulate; generating one or more simulations; executing the simulation model with data associated with the prioritized nodes in the tree in parallel to determine a posterior probability for each prioritized node; and determining whether each prioritized node is accepted or rejected based on the posterior probabilities. Numerous other aspects are provided.

23 Claims, 7 Drawing Sheets

(56) References Cited

U.S. PATENT DOCUMENTS

2014/0114443 A1* 4/2014 Bernstein ............ G06N 3/0635
                                                                          700/49

OTHER PUBLICATIONS

Pournara, Iosifina et al., "FPGA-Accelerated Bayesian Learning for Reconstruction of Gene Regulatory Networks", International Conference on Field Programmable Logic and Applications, Aug. 24-26, 2005, (pp. 323-328, 6 total pages).

Ordonez, Carlos et al., "Bayesian Classifiers Programmed in SQL", IEEE Transactions on Knowledge and Data Engineering, vol. 22, Issue 1, Jan. 2010, (pp. 139-144, 6 total pages).

Tu, Qin et al., "An Adaptive CU Mode Decision Mechanism Based on Bayesian Decision Theory for H.265/HEVC", IEEE International Conference on Multimedia and Expo (ICME), Jul. 14-18, 2014, (pp. 1-6, 6 total pages).

* cited by examiner

| $\theta_1$ | $\theta_2$ | $\theta_3$ | $\theta_4$ | $\theta_5$ | |
|---|---|---|---|---|---|
| 1 | 0 | 0 | 0 | 0 | 1.00 |
| 0 | 1 | 0 | 0 | 0 | .7 |
| 1 | 1 | 0 | 0 | 0 | .3 |
| 0 | 0 | 1 | 0 | 0 | .49 |
| 1 | 0 | 1 | 0 | 0 | .21 |
| 0 | 1 | 1 | 0 | 0 | .09 |
| 1 | 1 | 1 | 0 | 0 | .343 |
| 0 | 0 | 0 | 1 | 0 | .147 |
| 1 | 0 | 0 | 1 | 0 | 0147 |
| 0 | 1 | 0 | 1 | 0 | .063 |
| 1 | 1 | 0 | 1 | 0 | .147 |
| 0 | 0 | 1 | 1 | 0 | .063 |
| 1 | 0 | 1 | 1 | 0 | .063 |
| 0 | 1 | 1 | 1 | 0 | .027 |
| 1 | 1 | 1 | 1 | 0 | ... |
| 0 | 0 | 0 | 0 | 1 | |
| 1 | 0 | 0 | 0 | 1 | |
| 0 | 1 | 0 | 0 | 1 | |
| 1 | 1 | 0 | 0 | 1 | |
| 0 | 0 | 1 | 0 | 1 | |
| 1 | 0 | 1 | 0 | 1 | |
| 0 | 1 | 1 | 0 | 1 | |
| 1 | 1 | 1 | 0 | 1 | |
| 0 | 0 | 0 | 1 | 1 | |
| 1 | 0 | 0 | 1 | 1 | |
| 0 | 1 | 0 | 1 | 1 | |
| 1 | 1 | 0 | 1 | 1 | |
| 0 | 0 | 1 | 1 | 1 | |
| 1 | 0 | 1 | 1 | 1 | |
| 0 | 1 | 1 | 1 | 1 | |
| 1 | 1 | 1 | 1 | 1 | |

FIG. 3A 301
305  307  309  311  313

| $\theta_1$ | $\theta_2$ | $\theta_3$ | $\theta_4$ | $\theta_5$ |
|---|---|---|---|---|
| 1 | 0 | 0 | 0 | 0 |
| 0 | 1 | 0 | 0 | 0 |
| 1 | 1 | 0 | 0 | 0 |
| 0 | 0 | 1 | 0 | 0 |
| 1 | 0 | 1 | 0 | 0 |
| 0 | 1 | 1 | 0 | 0 |
| 0 | 0 | 0 | 1 | 0 |
| 0 | 0 | 0 | 0 | 1 |

| $\theta_1$ | $\theta_2$ | $\theta_3$ | $\theta_4$ | $\theta_5$ |
|---|---|---|---|---|
| 1 | 0 | 0 | 0 | 0 |
| 1 | 1 | 0 | 0 | 0 |
| 1 | 0 | 1 | 0 | 0 |

FIG. 3C 350
314  316  308  310  312

| $\theta_1$ | $\theta_2$ | $\theta_3$ | $\theta_4$ | $\theta_5$ |
|---|---|---|---|---|
| 0 | 0 | 1 | 0 | 0 |
| 0 | 0 | 0 | 1 | 0 |
| 0 | 0 | 1 | 1 | 0 |
| 0 | 0 | 0 | 0 | 1 |
| 0 | 0 | 1 | 0 | 1 |
| 0 | 0 | 0 | 1 | 1 |
| 1 | 0 | 0 | 0 | 0 |
| 0 | 1 | 0 | 0 | 0 |

FIG. 3D

MASSIVELY ACCELERATED BAYESIAN MACHINE

BACKGROUND

Bayesian methods are useful in modern data analytics as they may fuse sparse information with models of different fidelity levels. A Bayesian network is a representation of the probabilistic relationship among variables. The probability distribution specifies the strength of the relationship between variables. The Bayesian rule provides a standard set of procedures and formula to determine this relationship. A standard procedure used in solving the Bayesian rule is numerical integration. However, a problem with conventional Bayesian methods that use numerical integration is that numerical integration requires a large amount of computation, which can become computationally expensive. Conventionally, some solutions to the slow computations are to either simplify the models so that they can run fast enough, or to derive approximate solutions. The problem with both of these conventional approaches (model simplification and approximation) is that they lose accuracy. Another alternative is to employ heuristic approaches, which may be problem-specific and therefore may be very difficult to generalize.

Therefore, it is desirable to provide a system and method that more efficiently solves the Bayesian rule.

BRIEF DESCRIPTION

According to some embodiments, a method includes receiving data; providing a simulation model for the data; generating one or more simulations via a Bayesian module based on the data, wherein the simulation includes one or more nodes in a chain; executing the Bayesian module to determine the acceptability of the nodes in the simulation based on a Bayesian rule, wherein execution of the Bayesian module further comprises: generating a binary decision tree representing the chain in the simulation, wherein the chain includes one or more nodes; prioritizing which nodes in the tree to simulate; generating one or more simulations; executing the simulation model with data associated with the prioritized nodes in the tree in parallel to determine a posterior probability for each prioritized node; and determining whether each prioritized node is accepted or rejected based on the posterior probabilities.

According to some embodiments, a system includes one or more systems of record, wherein each system of record includes data; a simulation model operative to receive the one or more data elements and generate one or more simulations based on the one or more data elements, wherein the simulation includes one or more nodes in a chain; a Bayesian module operative to execute the simulation model to determine the acceptability of the nodes in the simulation based on a Bayesian rule, the Bayesian module operative to: generate a binary decision tree representing the chain in the simulation; prioritize which node in the tree to simulate; execute each prioritized node in the tree, in parallel, to determine a posterior probability for each prioritized node; and determine whether each prioritized node is accepted or rejected based on the posterior probability.

According to some embodiments, a non-transitory computer-readable medium stores program code, the program code executable by a computer system to cause the computer system to, via a Bayesian module: generate a binary decision tree representing a chain in a simulation, wherein the chain includes one or more nodes; prioritize which nodes in the tree to simulate; generate one or more simulations; execute each of the one or more prioritized nodes in parallel to determine a posterior probability for each prioritized node; and determine whether each prioritized node is accepted or rejected based on the posterior probabilities.

Some technical advantages of embodiments disclosed herein are improved systems and methods to facilitate the application of the Bayesian rule in a physical system in an accurate manner. A benefit of embodiments is increasing the speed of the application of the Bayesian rule by leveraging parallel computing architectures, without sacrificing convergence and by re-using a structure that allocates simulations. Another benefit of embodiments is solving complex problems with minimal approximation. Another benefit of embodiments is the ability to directly deploy the system and method to parallel computing architectures.

With this and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DRAWINGS

FIG. 3A-3D illustrate tables according to some embodiments.

DETAILED DESCRIPTION

Figure 1:
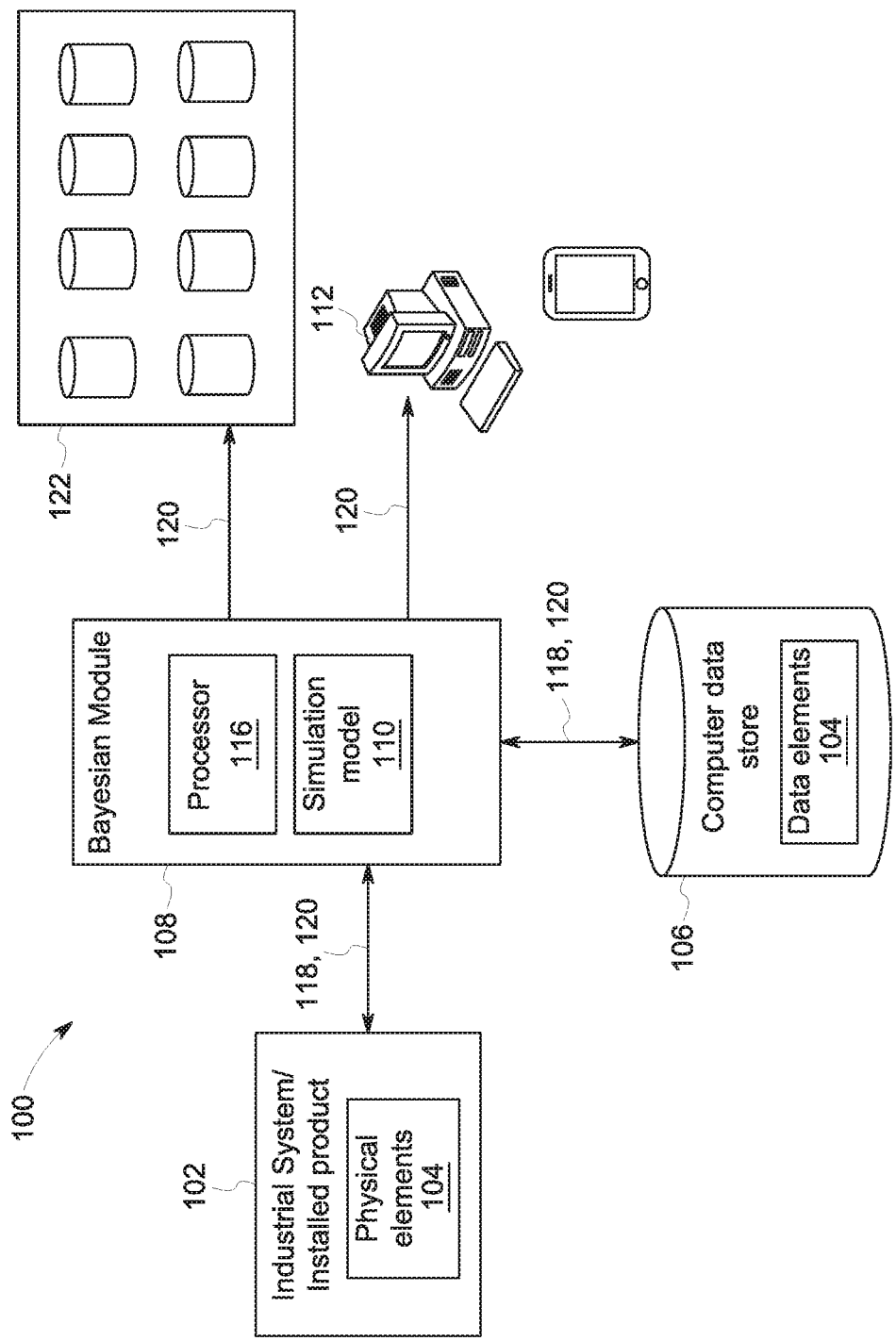
FIG. 1 illustrates a system according to some embodiments.

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

One or more embodiments or elements thereof can be implemented in the form of a computer program product including a non-transitory computer readable storage medium with computer usable program code for performing the method steps indicated herein. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Bayesian methods are useful in modern data analytics as they may fuse sparse information with models of different fidelity levels. Bayesian methods have been applied to problems in areas ranging from engineering, healthcare, social studies, astronomy, and other suitable areas. Some non-exhaustive examples include the use of Bayesian methods for noise reduction in image processing, flow parameter estimation in magnetic resonance imaging, text classification, prediction of a drill string stuck pipe event, determination of a probability of well success; damage identification; prediction of pore and fracture pressures of a subsurface formation; 3D printing shrinking compensation; electronic product service life modeling; prediction of turbine disk failure; and nonlinear digital image restoration.

A Bayesian network may be a representation of the probabilistic relationship among variables. Frequently, the variables may be of competing hypotheses. The Bayesian rule may relate the odds of event $A_1$ to the odds of event $A_2$ with respect to an observed event B. The Bayesian rule may show how one's judgement on whether $A_1$ or $A_2$ is true may be updated on observing the evidence B. The probability distribution or likelihood function may express the probability of the observed data under the two hypotheses/events and specifies the strength of the relationship between variables. The Bayesian rule may provide a standard set of procedures and formula to perform this calculation.

A standard procedure used in solving the Bayesian rule for the posterior distribution of model coefficients given the observed data may be numerical integration. However, a problem with conventional Bayesian methods using numerical integration is that numerical integration may require a large amount of computation, which becomes computationally expensive for most real world applications. Conventionally, some solutions to the slow computations are to either simplify the models so that the models may run fast enough, or to derive approximate solutions. The problem with both of these conventional approaches (model simplification and approximation) is that they lose accuracy. Another alternative is to apply heuristic approaches. However, heuristic approaches may be problem-specific and therefore may be very difficult to generalize.

The Bayesian rule may be solved by the use of a Markov chain Monte Carlo (MCMC) method, a numerical integration method suitable for handling probability distributions. A Markov chain is a random process that may undergo transitions from one state to another in a state space. The Markov chain may include the Markov property whereby the probability distribution of the next state depends only on the current state and not on the sequence of events that preceded it. MCMC methods may be used for calculating numerical approximations of multi-dimensional integrals in Bayesian statistics. The MCMC method output samples of the posterior distribution as samples of a Markov chain. The state of the chain after a number of steps may be used as a sample of the desired distribution. MCMC may be a general simulation methodology, and an inherently serial random process.

Conventionally, using MCMC involves serial computations whereby a simulation is evaluated and then a decision is made to accept or reject the simulation in the chain. Then the conventional method moves to the next simulation for evaluation and then acceptance/rejection determination and so on. The inventors note that Metropolis-Hasting, Gibbs sampling, or Metropolis-Hastings within Gibbs sampling are among conventional methods for Bayesian statistics.

In one or more embodiments, on the other hand, a plurality of evaluations are executed first, and then the acceptance/rejection determination is made for the plurality of evaluated simulations. The inventors note that embodiments may be a massive parallelization of Metropolis-Hastings within Gibbs sampling.

One or more embodiments may provide for solving complex problems with minimal approximations. The inventors note this may be applied to engineering and science applications in energy and propulsion systems, for example. In these cases, the simulations tend to be significantly expensive for conventional Bayesian methods. One or more embodiments provide for direct deployment of parallel computing architectures (e.g., execute the plurality of evaluations first, in parallel, and then the acceptance/rejection determination) and may not require any modification for scaling up with available computing resources. In one or more embodiments, the parallel architecture may overcome the limitations associated with model simplification and approximation.

In some embodiments, a binary decision tree may be used to pre-define simulations in large chains. This may enable the parallelization of the MCMC method described above. In one or more embodiments, the simulations for use in the MCMC method may come from random perturbations in the vector of uncertain variables one-at-a time (a process also called the "random walk").

Embodiments provide for the generation of a binary decision tree representing possible steps for a random walk through the chain. Then, embodiments provide for the pre-selection of branches in the decision tree where simulations may be allocated. In embodiments, the pre-selection of branches may provide for the pre-definition of the steps in the random walk. The pre-selection of branches may be based on an estimated acceptance rate in one or more embodiments. The pre-selection may allow for pre-allocation and therefore optimizing the number of required simulations. The acceptance rate may be an estimate of the probability of accepting a simulation represented as a node in the binary tree. In one or more embodiments, the acceptance rate may be a rate in which samples in each dimension are accepted throughout the numerical integration of Bayes rule. One or more embodiments provide for the re-use of the structure that allocates the simulations.

In some embodiments the acceptance rate may be learned during a burn-in phase and may be dynamically updated throughout execution of the method. As used herein, "burn-in phase" ("burn-in") may refer to a learning set of simulations and or experiments to collect data and generate an acceptance rate, as well as optimal step size for the random walk, prior to entering the actual numerical integration of the Bayesian rule via MCMC. As such, each node in the binary tree may have an estimated probability (e.g., chance) of being kept by the random walk. In embodiments, the selection of nodes for simulation may be determined by following the path with higher probabilities.

In embodiments, each layer of the tree may represent a step in one direction (i.e., a random perturbation of one of the uncertain variables). In some embodiments, each node of the binary decision tree may be a unique realization of the uncertain variables that has only one variable randomly perturbed (e.g., by a step size learned during the burn-in phase of the MCMC simulation) as compared to the one in the previous layer of the binary tree.

One or more embodiments provide for load balancing and resource utilization (e.g., maximizing the speed of computations for fast convergence). For example, as soon as it may be determined that a branch in the tree is not needed, the simulations on that branch may be stopped, freeing up the resources (e.g., cores) to use elsewhere, as described further below.

As used herein, the term "automatically" may refer to, for example, actions that may be performed with little or no human interaction.

FIG. 1 is a block diagram of a system 100 provided according to some embodiments. The system 100 may include a plant or "installed product" 102. The installed product 102 may include any sort of mechanically, electronically, chemically or physically operational entity. The term is most usefully applied to large complex systems with many moving parts and numerous sensors installed in the system. For example, the production line of a factory, a gas-fired electrical generating plant, a jet engine on an aircraft amongst a fleet, a wind farm, a locomotive, etc. The term "installed" includes integration into physical operations such as the use of engines in an aircraft fleet whose operations are dynamically controlled, e.g., a locomotive in connection with railroad operations, or apparatus construction in, or as part of, an operating plant building. The installed product 102 may include a considerable (or even very large) number of physical elements 104, which for example may include turbine blades, fasteners, rotors, bearings, support members, housings etc.

The system 100 may include a computer data store 106, and a Bayesian module 108. Data elements 103 in the data store 106 may include, for example, information about physical elements 104 of the installed product 102, such as historic engine sensor information about a number of different aircraft engines and prior aircraft flights (e.g., external temperatures, exhaust gas temperatures, engine model numbers, takeoff and landing airports, etc.). Other suitable data elements may be included.

In some embodiments, the Bayesian module 108 may include a simulation model 110. The computer data store 106 may provide information to the simulation model 110 via the Bayesian module 108, and may store results therefrom. For example, the simulation model 110 may be a cumulative damage model for service applications in turbomachining. This model may fuse inspection data with engine design and operational history and have the purpose of estimating metrics like component reliability over time, remaining useful life of parts and module risk. Other suitable models may be used.

The Bayesian module 108 may include one or more processing elements 116. The processor 116 may, for example, be a conventional microprocessor, and may operate to control the overall functioning of the Bayesian module 108.

In one or more embodiments, the data store 106 may comprise any combination of one or more of a hard disk drive, RAM (random access memory), ROM (read only memory), flash memory, etc. The data store 106 may store software that programs the processor 116 and the Bayesian module 108 to perform functionality as described herein.

The Bayesian module 108, according to some embodiments, may access the data store 106 and utilize the simulation model 110 to generate one or more potential simulations based on the one or more data elements, that will (or will not) be evaluated as the process runs. As will be further described below, each potential simulation may be represented by a node in a single chain, and the Bayesian module 108 may, in one or more embodiments, generate a simulation path of one or more nodes, based on estimated probabilities. The inventors note that an advantage of embodiments is to have only one chain throughout. The single chain may ensure that the Markov properties are preserved as the samples are gathered during numerical integration. The preservation may alleviate the problems with convergence as compared to other simplified parallel MCMC approaches.

In one or more embodiments, the simulation path may be transmitted to at least one of various user platforms 112, back to the installed product 102 or to other systems (not shown), as appropriate (e.g., for display to a user, operation of the installed product, operation of another system, or input to another system).

The Bayesian module 108 may be programmed with one or more software components that may model individual elements 104 that make up the installed product 102.

A communication channel 118 may be included in the system 100 to supply data from at least one of the installed product 102 and the data store 106 to the Bayesian module 108.

In some embodiments, the system 100 may also include a communication channel 120 to supply output from the Bayesian module 108 to at least one of user platforms 112, back to the installed product 102, to the data store 106 or to other systems (not shown). In some embodiments, signals received by the user platform 112, installed product 102 and other systems may cause modification in the state or condition or another attribute of one or more physical elements 104 of the installed product 102.

Although not separately shown in the drawing, one or more control units, processors, computers or the like may be included in the installed product 102 to control operation of the installed product 102, with or without input to the control units, etc., from the Bayesian module 108.

As used herein, devices, including those associated with the system 100 and any other devices described herein, may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol ("WAP") network, a Bluetooth network, a wireless LAN network, and/or an Internet Protocol ("IP") network such as the Internet, an intranet, or an extranet. Note that any devices described herein may communicate via one or more such communication networks.

A user may access the system 100 via one of the user platforms 112 (e.g., a personal computer, tablet, or smartphone) to view information about and/or manage an installed product 102 and/or develop simulations in accordance with any of the embodiments described herein. According to some embodiments, an interactive graphical display interface may let an operator develop and execute simulations, define and/or adjust certain parameters and/or provide or receive automatically generated recommendations or results.

Figure 2A:
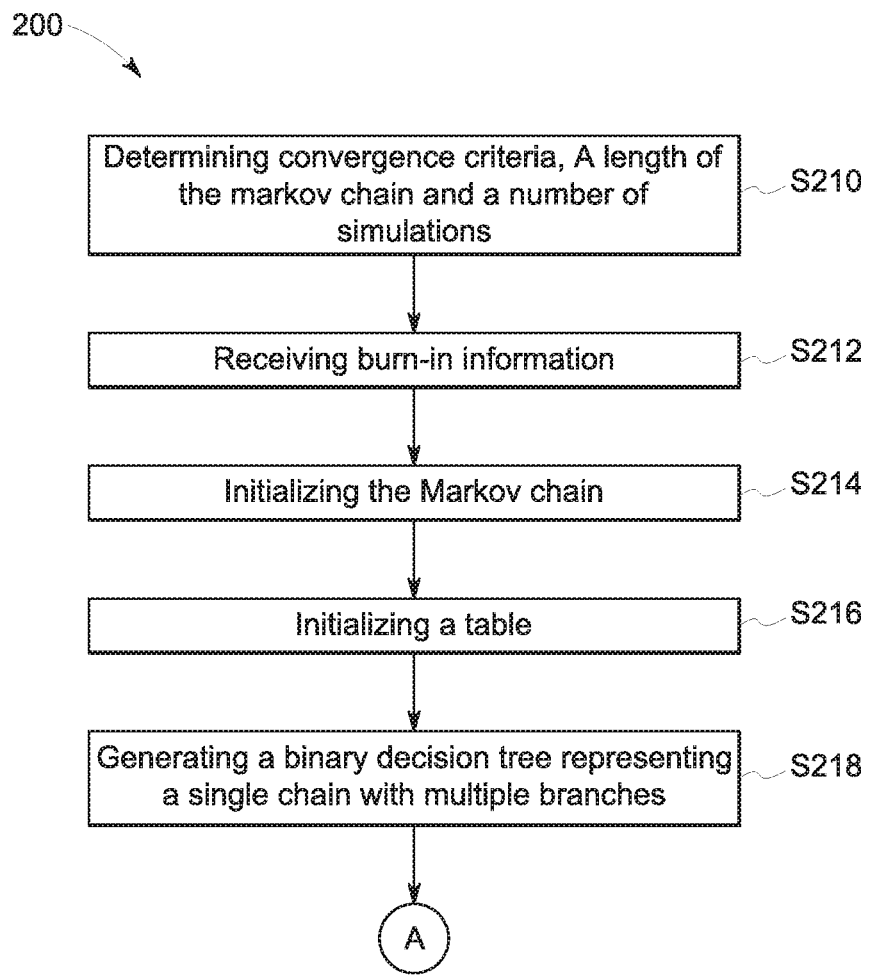
FIGS. 2A-2B illustrate a flow diagram according to some embodiments.
Figure 2B:
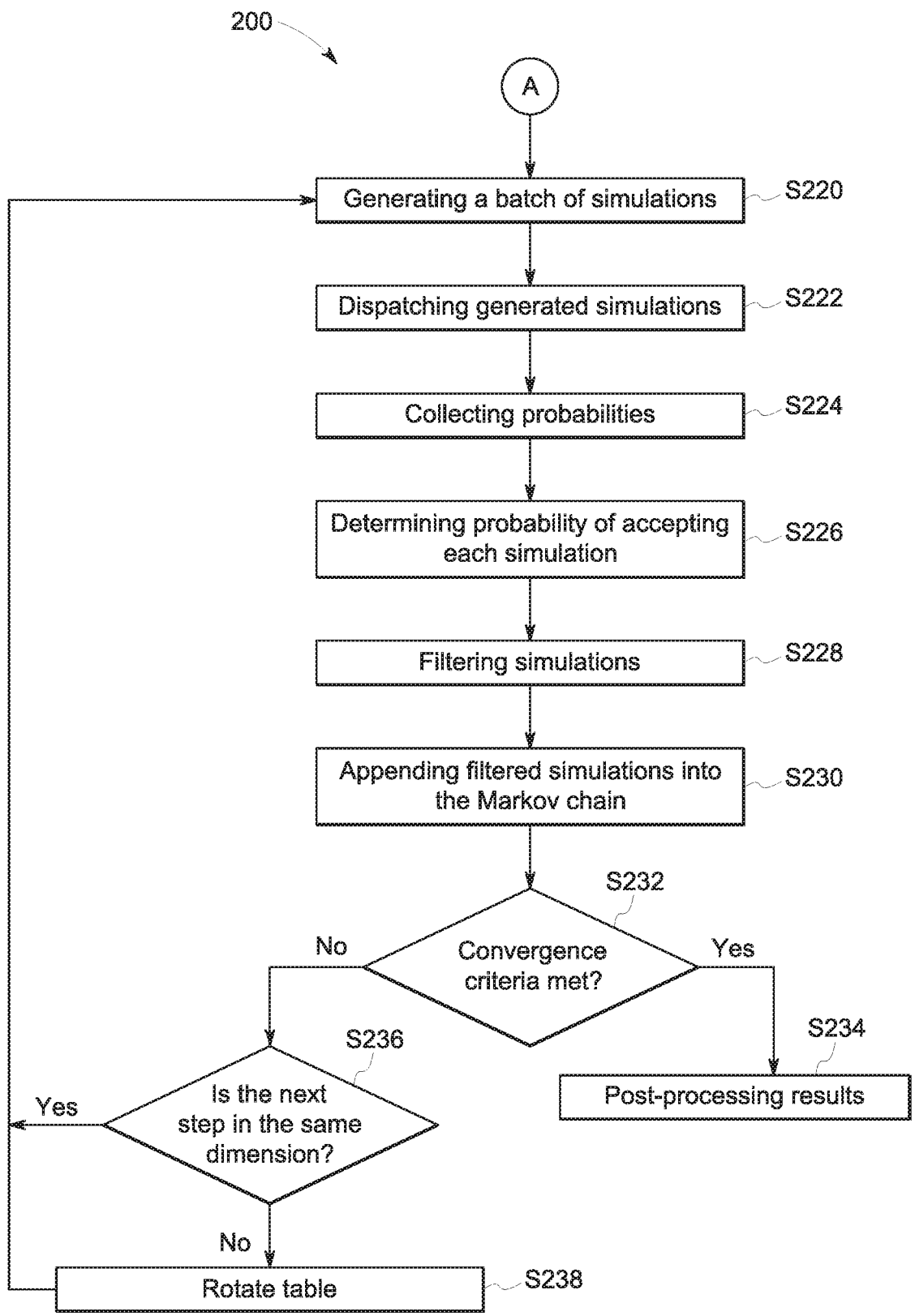
Figure 4:
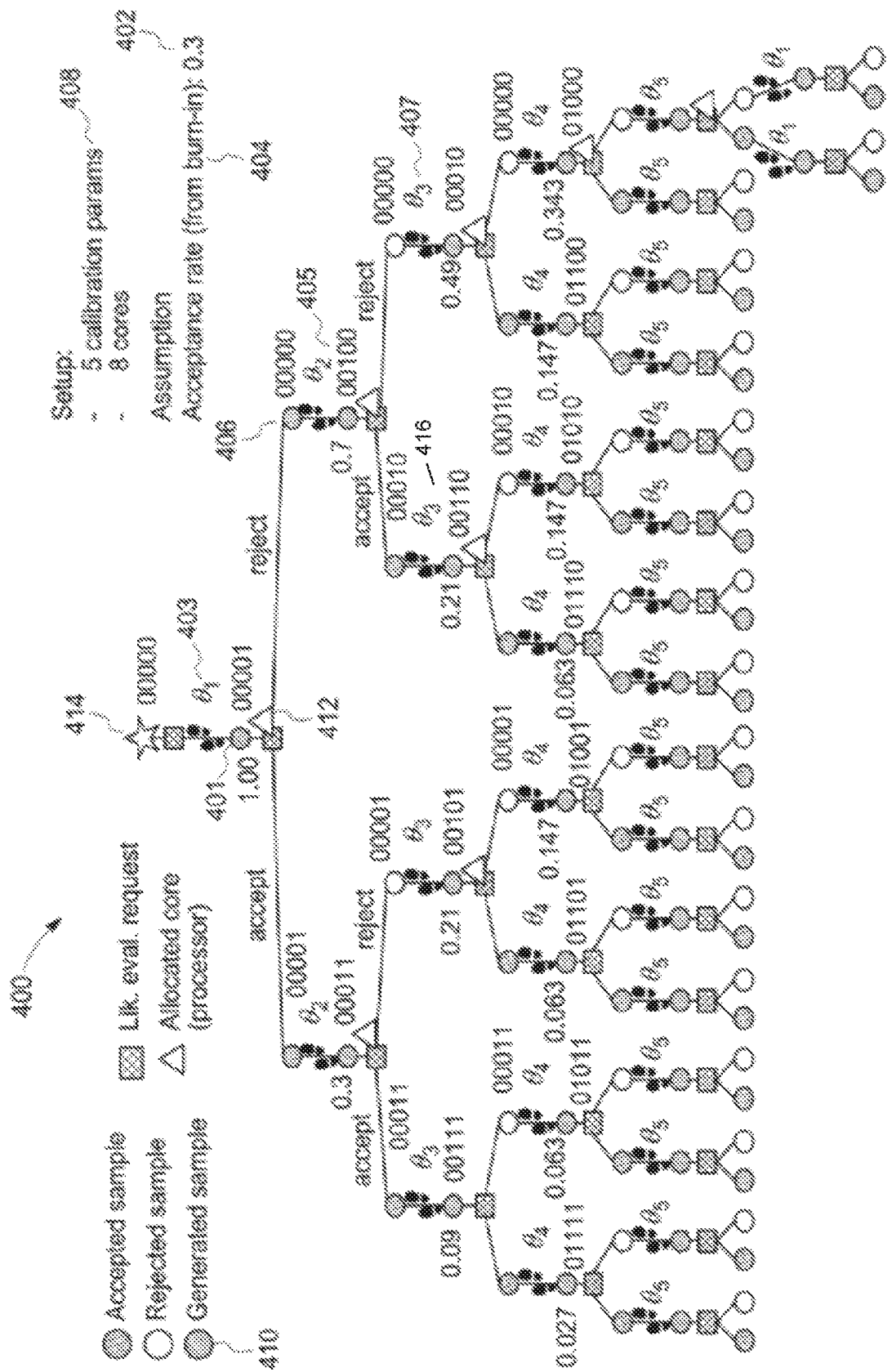
FIG. 4 illustrates a binary tree diagram according to some embodiments.

FIGS. 2-4 include a flow diagram of process 200 (FIG. 2) described with respect to the system 100 described above, according to some embodiments. Process 200 may be executed by Bayesian module 108 and an accelerated Bayesian platform 500 according to some embodiments, e.g., by execution of the programs 512/processing logic 514 (FIG. 5) to provide a user with desired simulations. In one or more embodiments, the platform 500 may be conditioned to perform the process 200, such that a processor 510 (FIG. 5) of the platform 500 is a special purpose element configured to perform operations not performable by a general purpose computer or device.

All processes mentioned herein may be executed by various hardware elements and/or embodied in processor-executable program code read from one or more of non-transitory computer-readable media, such as a hard drive, a floppy disk, a CD-ROM, a DVD-ROM, a Flash drive, Flash memory, a magnetic tape, and solid state Random Access Memory (RAM) or Read Only Memory (ROM) storage units, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

In one or more embodiments, a chain may include thousands of simulations to compensate for the simulations that may be discarded. To run through the thousands of simulations may take a lot of time. Conventionally, to decrease the time, the chain may be broken into smaller chains. For example, 10,000 simulations in one chain may be broken into 10 chains of 1000 simulations each (e.g., model simplification). However, as noted above, a problem with model simplification is that it loses accuracy in predicting the likelihood of the estimated parameters. The inventors note an advantage of embodiments is to have only one chain throughout the numerical integration, which may ensures that the Markov properties are preserved. This preservation may eliminate problems with convergence as compared to the mentioned simplified parallel MCMC approaches.

In one or more embodiments, a large amount of computer processing cores 122 ("cores") may be available, for example via cloud computing, to run the simulations in parallel. As is well known in the art, cloud computing, often referred to as simply "the cloud," is the delivery of on-demand computing resources—everything from applications to storage and data centers—over the Internet, in some instances on a pay-for-use basis. For example, a Hadoop cloud/cluster is a massively parallel architecture having at least 1000 cores may be available to run the simulations in parallel. Other parallel computing architectures include, but are not limited to, Cray and Blue Gene.

The inventors note that even with the large number of computer processing cores, it may still take a lot of time to run the simulations for all of the possible walks in the full binary tree, as the number of simulations may grow exponentially. For example, while ~$10^3$ simulations may be required if a full binary tree is simulated when performing 10 steps in a random walk, ~$10^6$ simulations are required for 20 steps. For the thousands of steps needed for numerical integration, the computational cost could be prohibitive. As such, one or more embodiments provide smart strategies for pre-allocation of simulations that are likely to be in the path selected by the random walk.

Initially, at S210, convergence criteria (e.g., time elapsed since simulations began, number of elements in the Markov chain, or stationarity across the Markov chain), a length of the Markov chain (e.g., depth of the nodes), and a number of simulations (e.g., computations) per iteration may be determined.

In one or more embodiments, each potential simulation may be represented by a node 406 in a binary tree 400 (FIG. 4). The inventors note that while each simulation is a node, not all the nodes will be allocated for execution (the allocated ones may be determined using the acceptance rate), and even if they are all allocated, the simulations may not be needed as rejection may be implemented as a mechanism for load balancing, as described below. Regarding a depth of the node, given a number of available processing units (cores) 122, one or more embodiments may provide for pre-defining how deep in the decision tree the simulations are going to reach given a current acceptance rate. In one or more embodiments, a number of nodes in the full binary decision tree ($n_{NODES}$) at given depth ($n_{DEEP}$) may be represented by the following equation:

$$n_{NODES} = 2^{n_{DEEP}} - 1$$

where depth also represents the number of steps in the random walk. As used herein, the term "dimension" refers to each uncertain variable being sampled by the MCMC algorithm (e.g., if the posterior distribution describes the joint distribution of three uncertain variables, there are three dimensions). As used herein, the term "steps" in each dimension refers to the process of randomly drawing from a proposal distribution a sample to be evaluated (steps as in steps in the random walk). As described above, the number of dimensions may be based on the number of categories or calibration parameters for which simulations are being generated. Embodiments provide for a recursive walk one step in each dimension at a time, such that after walking one step in the last dimension, the process returns to the first dimension. In embodiments, the sequence of steps together with the rejection/acceptance may generate the chain (e.g., current sample is conditional on the previous one).

As such, in one or more embodiments, $n_{DEEP}$ is first determined to provide an estimate of how deep to make the binary tree given the number of cores available for computation. Then, $n_{CORES}$ is input to the equation above to eventually determine which simulations to generate.

In a non-exhaustive example that will be used throughout the specification, the system 100 is estimating 5 parameters 408 (FIG. 4) (e.g., "calibration parameters") with 8 cores available for evaluating the nodes in the binary tree. Any suitable number of parameters and nodes may be used. In this example, for 5 parameters, based on the above equation, the number of nodes in the full binary tree to represent a random walk that starts in the first dimension and comes back to the first dimension is equal to $2^5-1=31$ (which discount the current state). This means that, if all the nodes were to be evaluated at once, 31 cores would be needed, while only 8 are available. The equation above and the scheme for picking which nodes from the tree to evaluate (further described below) may make it possible to walk from the first dimension through all other for dimensions and back to the first dimension with only 8 processors. The confirmation of how deep in the tree the walk was able to go may only come after applying the rejection/acceptance step with the actual probabilities coming from fully-fledged simulations.

Turning back to the process 200, in S212, the module 108 receives the burn-in information 402 (FIG. 4) for association with the parameters being estimated in one or more embodiments. In one or more embodiments, the burn-in information 402 may include an acceptance rate 404. In one or more embodiments, the burn-in may include other suitable information like the optimized step size for the random walk. In one or more embodiments, the burn-in information 402 may be based on a learning set of simulations used to generate the acceptance rate 404. As shown in FIG. 4, for example, the acceptance rate 404 from the burn-in is 0.3. Again, the acceptance rate may be an estimate of the probability of accepting a simulation represented as a node in the binary tree. In one or more embodiments, this estimate may be updated as the process runs.

The Markov chain may be initialized with an initial sample in S214. In one or more embodiments, the first sample may be received during burn-in.

In one or more embodiments, a binary tree 400 (FIG. 4) may be generated in S216 via allocation/mapping of nodes of the simulation path, representing a single chain with multiple branches. Then in S218, in one or more embodiments, a table 300 (FIG. 3A) is initialized with simulations generated via the Bayesian module 108. In one or more embodiments, the binary tree 400 may be the graphical representation of the table 300 (FIG. 3A). While the method 200 described herein has the tree generated prior to the initialization of the table, in one or more embodiments, these steps may be reversed.

In keeping with the example, a table 300 in FIG. 3A shows the 31 simulations. In one or more embodiments, each column in the table represents a step in each direction, while the rows in the table represent different nodes (simulation points) in the decision tree 400 (FIG. 4). In one or more embodiments, each simulation in the table may be represented in binary numbers. In one or more embodiments, the number of digits representing the simulation may be based on the number of parameters. In one or more embodiments, the binary number may identify the number of steps to walk-through in each dimension.

In the example described herein, there are 5 parameters, so the simulations in the table 300 may be represented by 5 digits. For example, the first simulation 302 may be represented in the table 300 as 10000 in binary notation, and the second simulation 304 may be represented in the table 300 as 01000, etc. For the first simulation 302, there may only be one step and it may be in the first dimension 375. For the second simulation 304, there may be only one step and it may be in the second dimension 377. The inventors note that the resources in the memory 530 used by this chart 300 may be decreased because the discrete operations may be converted to the binary chart and therefore shrunk, making it a very flexible process for massive parallelization for performing MCMC simulations to estimate the Bayesian rule.

In one or more embodiments, the probability of accepting each simulation may be computed. In one or more embodiments, the probability may be included in the table 300. In one or more embodiments, the probability of retention $p_{ret}$ (e.g., probability of acceptance of a simulation) may be estimated with the acceptance rate $p_{actp}$ and the binary representation of the node truncated.

Keeping with the example described above, with five calibration parameters, the binary representation may be $B=[D_5\ D_4\ D_3\ D_2\ D_1]$. In one or more embodiments, the first step may be to truncate this representation to the minimum number of digits needed for representing the node depth. For example, a node representing the steps in the third calibration parameter has binary representation of the type $B=[0\ 0\ D_3\ D_2\ D_1]$, where $D_i$ can be either 1 or 0. The truncated representation is $B^*=[D_3\ D_2\ D_1]$ (zeros to the left of the first 1 are neglected). The probability of retention $p_{ret}$ may be estimated by $$p_{ret}(B)=\Pi_{i=1}^{nB*}((D_i\times p_{actp})+(\sim D_i)\times(1-p_{actp})),$$

where $\sim$ is the logical NOT operator. The probability of retention $p_{ret}$ is computed for each node in the tree, up to $n_{DEEP}*$. The nodes that will be kept for simulation are $n_{CORES}$ nodes with the highest $p_{ret}$ values (in case of a tie, keep the node with lower decimal representation, as this would be shallower node compared to the others). In one or more embodiments, $p_{ret}$ values may be used to prioritize which nodes in the tree to simulate (e.g., ranking the $p_{ret}$ values from highest to lowest). In one or more embodiments, prioritizing which nodes in the tree to simulate may estimate an acceptance/rejection path in the binary decision tree 400.

The table 300 may include the probability of acceptance 306 for each simulation.

As shown in FIG. 4, each hash-marked circle 410 represents a generated simulation or sample corresponding to a simulation 302 (E.g., first simulation 302 and second simulation 304) in the table 300. In keeping with the example, the tree 400 includes 31 hash-marked circles or nodes 410 representing the 31 simulations in table 300.

In one or more embodiments, each node 410 may therefore be represented as an integer or in binary. For example, the first simulation 302 in the table 300 may be represented as node 1 (integer) and may also be represented as 10000 (binary). Likewise, the second simulation 304 in the table 300 may be represented as node 2 (integer) and may also be represented as 01000 (binary). As shown here, the binary numbers in the binary tree are shown from right to left, while in the corresponding tables, the binary numbers are shown from left to right.

In one or more embodiments, the generated simulations in the table 300 may be filtered to select the nodes/simulations that will be executed in the core 122. In one or more embodiments, the table may represent a batch of simulations to be run in parallel. The process may iterate over the data in the table several times. The inventors note that deciding which nodes to execute first in this manner may maximize the odds of getting as deep as possible in the Markov chain. In one or more embodiments, the several levels of the binary tree may represent steps in the random walk; and every time the acceptance/rejection step is passed through, a state in the Markov chain is also passed through. The deeper you go in the chain, the more states you have passed through. In embodiments, the states are the samples generated during numerical integration of the Bayesian rule. As such, going as deep as possible in the binary tree with the available number of computer cores may be a measure of computational speed for the numerical integration. In one or more embodiments, the generated simulations may be filtered based on the number of cores 122 available to run the simulations. In one or more embodiments, the nodes with the highest probabilities may be kept for an initial execution, or executed with high priority, in the cores 122. In one or more embodiments, if multiple nodes have the same probability, the point with the lower decimal representation may be kept (as they are associated with shallower depth in the binary tree, as compared to higher decimals).

The inventors note that more simulations may be generated than are needed, such that the simulations with a lower probability of being selected may be filtered out. In keeping with the example, there are 8 cores 122 available. Budget constraints (e.g., number of cores) may prevent all 31 simulations from being run at the same time (in parallel). In the example described herein, the top 8 probabilities may be selected, as highlighted in the table 300 and with a darkened triangle 412 in the tree 400.

In one or more embodiments, other factors in deciding how to filter out simulations may include, for example, 1. numerical convergence of actual simulations. It may be that some nodes (regardless of where they are in the binary tree) may not converge numerically and as such the outputs of the model may not be useful; 2. stalling of simulations. It may happen that simulations get stuck because the combination of the calibration parameters may be that the simulations take too long, which may also be a sign that results may not be useful; 3. Loss of communication between master and slave nodes in the parallel computing architecture. The inventors note that the master node may discard the slave node where any of numerical convergence of actual simulations, stalling of simulations, and loss of communication between master and slave nodes, occurs, as well as the branch underneath it in the binary tree. The inventors note that the robustness of the system (e.g., discarding these nodes that may have errors) may be another benefit of embodiments.

In one or more embodiments, the filtering may also be referred to as applying a "mask" to the decision tree. In FIG. 3A, the highlighted rows may correspond to the nodes that will be assigned to the cores 122 for evaluation in the first round (FIG. 3B).

Then in S220, a batch (e.g., one or more) of simulations may be generated. In one or more embodiments, the batch may be generated via perturbations on a last state in the Markov chain using the table 300 that maps the nodes in the tree 400 and a step size in each dimension. As used herein, the "chain" or "Markov" chain refers to the set of samples that will be collected throughout the numerical integration.

In one or more embodiments, a random number may be generated in a design space. In one or more embodiments, "design space" may refer to the bounds for a given probability distribution. In one or more embodiments, the bounds may be based on a prior distribution. In one or more embodiments, the prior distribution may be what the user thinks the parameters should be before bringing in new data, based on engineering judgment and domain knowledge (e.g., best guess based on prior knowledge). For example, if the user is trying to estimate distribution of thermal conductivity of a new aluminum alloy, the user may consult the literature to see what the range of conductivity is for known aluminum and aluminum alloys, and base the bounds on that information. Observed data and simulation models are then used to update the prior information through numerical integration of the Bayesian rule. To start with this numerical integration, a random sample is created within the design space (or alternatively, this point may can also come from burn-in). In FIG. 4, this random number 414 may be represented by the star in the chart 400.

As used herein, generating a data sample or simulation associated with a node that differs slightly (e.g., slight perturbation) from the previous data sample only with respect to the dimension computing walking in may be referred to as "walking". In one or more embodiments the table 300 may be a binary representation that indicates how many steps to walk in a given dimension. The table 300 may not indicate "how big" the step is. In one or more embodiments, the step size may be learned during burn-in. In one or more embodiments, walking one step may be equivalent to add or subtract a multiple of this step size to the current value. This "multiple" of the step size may be randomly generated and may be positive or negative, hence the term "random walk." In the example described herein, starting with the random number 414, a data point for association with a first generated simulation 401, and each of the 8 simulations to be dispatched is generated (following the tables in FIG. 3B). In one or more embodiments, the computations are executed for the nodes that will eventually be evaluated. In this example, 8 nodes. The inventors note that the number of computer cores may be very large (thousands), which may make the path very deep in the binary tree (and in turn, the actual number of nodes may be way more than one can possibly afford simulating). As such, a benefit of embodiments is that only the nodes that are likely to be in the acceptance/rejection path of the tree are evaluated, thereby minimizing wasteful computations.

Then in S222, the generated simulations for the selected nodes are dispatched to, and executed by, the cores 122. In one or more embodiments, at the core 122 the data point associated with each selected simulation is input to the model 110, and the model 110 is executed. In one or more embodiments, the model 110 is used to get the likelihood of the observed data given the sampled set of parameters. In one or more embodiments, the generated simulations for the selected nodes may be dispatched to the cores 122 in parallel. The inventors note that conventionally, a chain may be broken into smaller pieces, and these smaller pieces from different trees may be evaluated in parallel. This is unlike embodiments described herein whereby evaluations in one chain are modeled through the binary tree and the acceptance/rejection scheme with simulations running in parallel. The main benefit of having only one chain is convergence of numerical integration.

In S224, the posterior probabilities resulting from the execution may be collected. In one or more embodiments, the model 110 may include two types of inputs: known inputs and unknown inputs (e.g., calibration parameters). When solving the Bayesian rule, the unknown inputs are sampled. In one or more embodiments, the model 110 may output a quantity (e.g., temperature), which may then be contrasted against observations (e.g., temperature readings from experiments) through a likelihood model. In one form of the Bayes rule implementation, the likelihood times the prior distribution of calibration parameters is what gives the posterior probability (except for a constant). In one or more embodiments, the cores 122 may complete execution of the simulations synchronously (at the same time), or may complete execution of the simulations asynchronously (at different times). In one or more embodiments, if the resulting probabilities are returned asynchronously, a user may decide whether to continue execution of the dispatched simulations.

For example, in FIG. 4, if the user decides to keep the resulting probability associated with simulation 00001, then the user may stop execution of the simulations on the right of the tree 400, associated with the "reject" branch, thereby freeing 5 cores 122 (associated with the 5 triangles) to run other simulations on the "accept" branch. In one or more embodiments, the cores 122 may not be idle until the process 200 ends, because as simulations are executed, the acceptance/rejection step is applied dynamically (S226), and the next round of simulations dispatched for execution, as further described above. The inventors note that by ceasing execution for nodes that are not needed may provide additional time-savings. The inventors also note that the execution at the cores 122 may be a dynamic process as the cores 122 may complete the execution asynchronously.

Then in S226, a probability of accepting each simulation is determined. In one or more embodiments, as simulations are collected, the next step is to apply the acceptance/rejection step S226 for each collected probability associated with the node ("collected node").

As used herein, the "acceptance/rejection" step refers to generating a random number that may assume one of two values (0, 1) associated with the probability of accepting the collected probability associated with the node. For example, if the number comes back as 1, accept the collected node, and if the number comes back as 0, reject the collected node. In one or more embodiments, FIG. 2 may be similar to Metropolis-Hasting within Gibbs, except that the evaluations are computed in embarrassingly parallel fashion (with the benefit of speeding up the overall convergence of numerical integration). The sampled chain follows the nodes in the acceptance/rejection step up until a terminal node is reached. As shown in FIG. 4, a terminal node may be a node with a triangle, with no other triangles beneath it.

In one or more embodiments, the decision of keeping or rejecting collected nodes may come from the ratio of posterior between the sampled points. The inventors note that in one of its forms, the Bayes rule may be written as $$f_{POSTERIOR}(\theta|DATA) \propto \text{Likelihood}(DATA|\theta) \times f_{PRIOR}(\theta)$$

The symbol $\propto$ means proportional, so the ratio of the right hand side is what is used. After the probabilities are collected, the resulting probabilities are plugged into the above computation of posterior distribution. In one or more embodiments, the resulting number may be used in the decision to accept or reject the collected node, which may be done sequentially. In one or more embodiments, the ratio is the comparison of two nodes: the current one and the one that is candidate for next state in the Markov chain.

Then in S228, the simulations are filtered by applying the acceptance/rejection scheme (just like in Metropolis-Hasting). More precisely, a uniform sample S between 0 and 1 is generated. If $S \leq \rho$, where $\rho$ is the ratio between the posterior distributions of the new sample and the current sample in the chain (capped at 1), then the new sample is accepted, otherwise it is rejected.

Then in S230, the filtered simulations may be appended into the Markov chain. In one or more embodiments, at the end of acceptance/rejection in S226, the chain may be augmented with the simulations along the acceptance/rejection path. The deepest node in that path may then be the new current state (e.g., star in FIG. 4) and the process 200 may start all over again for as many times as the user decides is pertinent. The inventors note that in many applications, the number of times the process 200 is going to iterate may be such that thousands of samples are kept in the chain.

In one or more embodiments, it is determined whether the convergence criteria has been met. If one or more convergence criteria have been met in S232, the process 200 proceeds to S234 and the results may be further processed (e.g., the integration may be used to estimate things like mean output values, most likely values for calibration parameters, expected discrepancy between simulations and experiments, etc.).

If the criteria has not been met in S232, the process 200 proceeds to S236 and it is determined if the next step (e.g., level in the tree 400) is in the same dimension as that which was walked through, as described above. If it is determined in S236 that the next step is in the same dimension, return to S220 to generate more simulations.

If is determined in S236 the next step is in a different dimension, re-assign the binary representation of the new terminal node to be [00000], and rotate the matrix (e.g., table 300) in S238. In one or more embodiments, when the next step is in a different dimension, the table 301 (FIG. 3B) may be rotated or shifted to accommodate the step in the next dimension (e.g., to line up with the dimension in which the walk will begin, since the table 300 was originally designed for a walk in the first dimension). In one or more embodiments, the rotation or shifting of the table 300 in a circular pattern may provide a new set of nodes to be evaluated. In one or more embodiments, reusable elements of the computation may be stored in binary representation for accelerating overall computations. The inventors note that shifting the table in a circular pattern provides for the re-use of the prioritization and selected nodes as a new set of nodes to be evaluated. For example, by rotating the table, the previous computations (e.g., assigning the most likely acceptance/rejection path and allocation of nodes in the tree that will be simulated) have already been determined for the preceding levels (e.g. with relation to FIG. 4, that would be all the nodes marked with brown triangles) and may be transferred without having to re-do the computations. The process 200 then returns to S220 and generation of a batch of simulations. In one or more embodiments, rotation of the table may provide for a reuse of previously computed data structures and resource allocation (which may turn in extra savings in computational time).

Keeping with the example in FIG. 4, the starting random number 414 is associated with 00000. A walk in the first dimension ($\theta_1$) 403 yields the first generated sample 401 at 00001. If the first generated sample 401 is accepted in the acceptance/rejection step of S226, then the two elements in the chain are 00000 and 00001. If the first generated sample is rejected (i.e., not accepted), then the chain has two equal consecutive states (00000 and 00000). The next step in the walk proceeds in the second dimension (02), for the case of rejection of the sample in the first dimension that becomes 405. If the step in the second dimension 405 is accepted, then the terminal node 416 may be identified as [00110]. With respect to the tables, if the step in the first dimension 403 is accepted, then table 301 (FIG. 3B) reduced to table 303 (FIG. 3C).

Continuing with the example in FIG. 4, all simulations represented by triangles have already been dispatched to the cores 122 (after all, this is a massively parallel implementation). If, for example, we have accepted the simulations at 00001 and 00011, the next logical step would be ($\theta_3$), which has not yet been dispatched (e.g., as there is no triangle at 00111). The inventors note that, at this point in the numerical integration, the chain is constituted by the nodes 00000, 00001, and 00011 and all the simulations at the other nodes were rejected. The inventors further note that, in this example, even though 8 points were simulated initially, there may only be 3 in the chain, thus far, because of the acceptance/rejection in S230. The computational load balancing mechanism works such that, as soon as a branch underneath a node is sensed to be rejected, the respective nodes are freed up and a new set of simulations is immediately dispatched in the current acceptance/rejection path.

Back the example in FIG. 4, with the current chain being constituted by the nodes 00000, 00001, and 00011. If the next logical step would be ($\theta_3$), and the table 301 (FIG. 3B) is designed for ($\theta_1$), the columns may be shifted to the right until what was originally in the first column 305 in table 301 (FIG. 3B) is now the third column 308 in table 350 (FIG. 3D); what was originally in the second column 307 in table 301 (FIG. 3B) is now in the fourth column 310 in table 350 (FIG. 3D); what was originally the third column 309 in table 301 (FIG. 3B) is now the fifth column 312 in table 350 (FIG. 3D); what was originally the fourth column 311 in table 301 (FIG. 3B) is now the first column 314 in table 350 (FIG. 3D); and what was originally the fifth column 313 in table 301 (FIG. 3B) is now the second column 316 in table 350 (FIG. 3D). The process 200 may then return to S220, and in one or more embodiments, the process of dispatching simulations, collecting posterior probabilities, and acceptance/rejection iterates until a stopping criterion is met. In one or more embodiments, the actual acceptance/rejection of each node may be defined by a ratio of the posterior probabilities. It is very common that a predefined length for the chain is used as stopping criterion. For example, the process iterates until the chain has 50,000 states (with each state being a node that could have been either accepted or rejected throughout the random walk).

Figure 5:
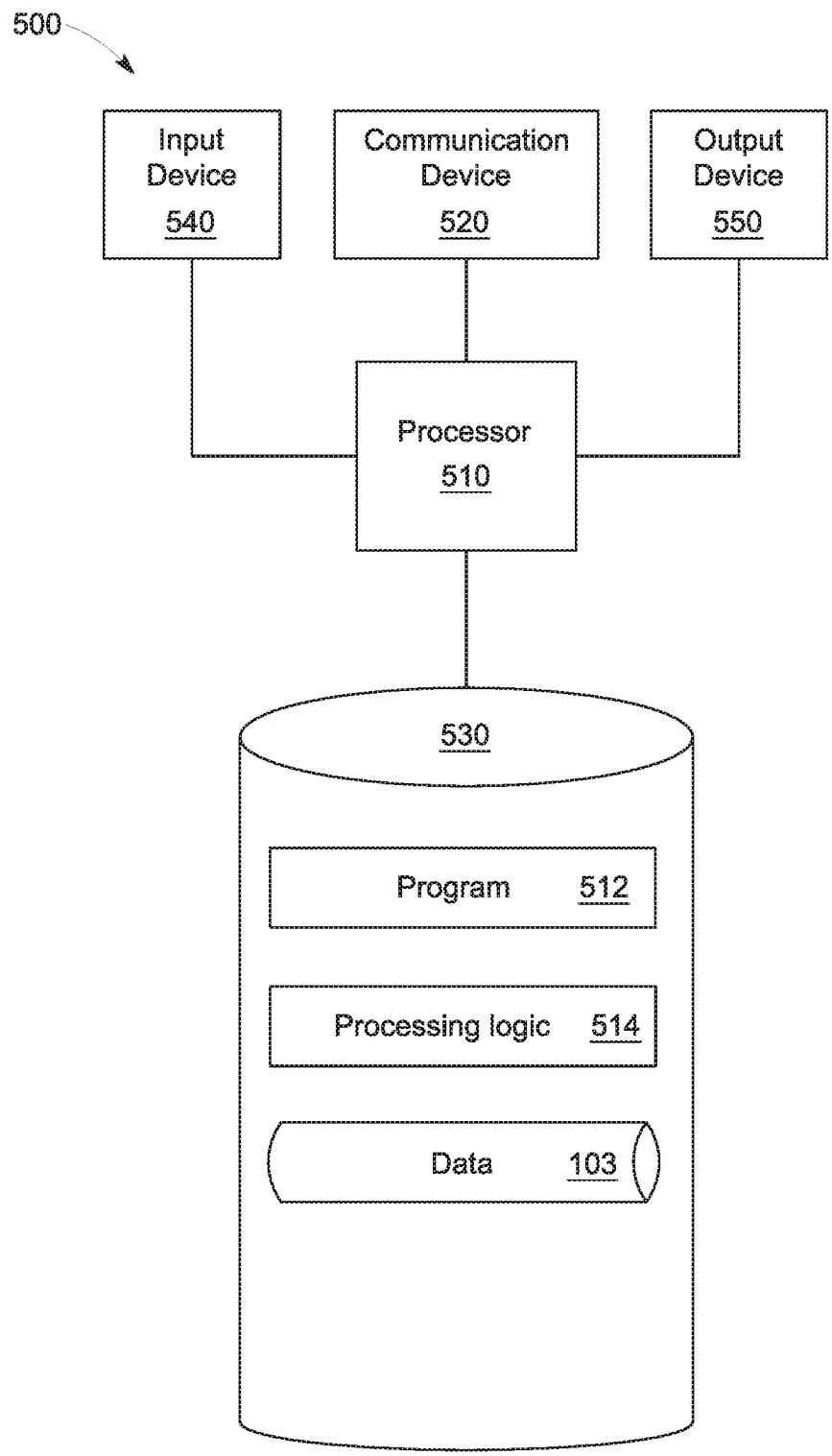
FIG. 5 illustrates a block diagram of a system according to some embodiments.

Note the embodiments described herein may be implemented using any number of different hardware configurations. For example, FIG. 5 illustrates an accelerated Bayesian platform 500 that may be, for example, associated with the system 100 of FIG. 1. The accelerated Bayesian platform 500 comprises an accelerated Bayesian processor 510 ("processor"), such as one or more commercially available Central Processing Units (CPUs) in the form of one-chip microprocessors, coupled to a communication device 520 configured to communicate via a communication network (not shown in FIG. 5). The communication device 520 may be used to communicate, for example, with one or more users. The accelerated Bayesian platform 500 further includes an input device 540 (e.g., a mouse and/or keyboard to enter information about the measurements and/or assets) and an output device 550 (e.g., to output and display the data and/or recommendations).

The processor 510 also communicates with a memory/storage device 530. The storage device 530 may comprise any appropriate information storage device, including combinations of magnetic storage devices (e.g., a hard disk drive), optical storage devices, mobile telephones, and/or semiconductor memory devices. The storage device 530 may store a program 512 and/or accelerated Bayesian logic 514 for controlling the processor 510. The processor 510 performs instructions of the programs 512, 514, and thereby operates in accordance with any of the embodiments described herein. For example, the processor 510 may receive data elements from the cache and system of record and then may apply the Bayesian module 108 via the instructions of the programs 512, 514 to analyze the data and properly sample the posterior distribution.

The programs 512, 514 may be stored in a compressed, uncompiled and/or encrypted format. The programs 512, 514 may furthermore include other program elements, such as an operating system, a database management system, and/or device drivers used by the processor 510 to interface with peripheral devices.

As used herein, information may be "received" by or "transmitted" to, for example: (i) the platform 500 from another device; or (ii) a software application or module within the platform 500 from another software application, module, or any other source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, an analytic module. The method steps can then be carried out using the distinct software modules and/or sub-modules of the system, as described above, executing on one or more hardware processors 510 (FIG. 5). Further, a computer program product can include a computer-readable storage medium with code adapted to be implemented to carry out one or more method steps described herein, including the provision of the system with the distinct software modules.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A method comprising:
   receiving data;
   providing a simulation model for the data;
   generating one or more simulations via a Bayesian module based on the data, wherein each generated simulation includes one or more nodes in a chain;
   executing the Bayesian module to determine the acceptability of the one or more nodes in each generated simulation based on a Bayesian rule, wherein execution of the Bayesian module further comprises:
      generating a binary decision tree representing the chain in each generated simulation, wherein the chain includes one or more nodes;
      ranking the one or more nodes based on a probability of retention to prioritize which nodes in the binary decision tree to simulate;
      executing the simulation model with data associated with the prioritized nodes in the binary decision tree in parallel to determine a posterior probability for each prioritized node; and
      determining whether each prioritized node is accepted or rejected based on the posterior probabilities.

2. The method of claim 1, wherein the chain is a Markov chain.

3. The method of claim 1, further comprising:
selecting the prioritized nodes to execute in a first round of execution, prior to executing the simulation model, wherein the selected prioritized nodes are nodes likely to be in the chain.

4. The method of claim 3, wherein the prioritization and selection of nodes uses an estimated acceptance rate.

5. The method of claim 4, wherein the estimated acceptance rate is a rate in which samples in each dimension are accepted throughout the numerical integration of Bayes rule.

6. The method of claim 1, wherein prioritizing which nodes in the binary decision tree to simulate further comprises:
estimating an acceptance/rejection path in the binary decision tree.

7. The method of claim 3, further comprising:
generating a table including data associated with the selected prioritized nodes, wherein the table is representative of the prioritized and selected nodes and wherein each of the prioritized and selected nodes is represented in binary format.

8. The method of claim 7, further comprising:
determining if a convergence criteria has been met.

9. The method of claim 8 further comprising:
shifting the table in a circular pattern to re-use the prioritized and selected nodes as a new set of nodes to be evaluated.

10. A system comprising:
an accelerated Bayesian platform including an accelerated Bayesian processor;
one or more data elements;
a simulation model operative to receive the one or more data elements and generate one or more simulations based on the one or more data elements, wherein each simulation includes one or more nodes in a chain;
a Bayesian module operative to execute, via the accelerated Bayesian processor, the simulation model to determine the acceptability of the one or more nodes in each simulation based on a Bayesian rule, the Bayesian module operative to:
generate a binary decision tree representing the chain in each simulation;
rank the one or more nodes based on a probability of retention to prioritize which node in the binary decision tree to simulate;
execute each prioritized node in the binary decision tree, in parallel, to determine a posterior probability for each prioritized node; and
determine whether each prioritized node is accepted or rejected based on the posterior probability.

11. The system of claim 10, wherein the chain is a Markov chain.

12. The system of claim 10, wherein the Bayesian module is further operative to:
select the prioritized nodes to execute in a first round of execution prior to actual execution of each of the one or more nodes in the binary decision tree,
wherein the selected prioritized nodes are nodes likely to be in the chain.

13. The system of claim 12, wherein the prioritization and selection of nodes uses an estimated acceptance rate.

14. The system of claim 13, wherein the estimated acceptance rate is the rate in which samples in each dimension are accepted throughout the numerical integration of Bayes rule.

15. The system of claim 10, wherein prioritization of which nodes of the binary decision tree to simulate further comprises:
determining a terminal level in the binary decision tree.

16. The system of claim 13, wherein generation of the binary decision tree further comprises:
applying a mask to a table of simulations.

17. The system of claim 16, wherein the Bayesian module is further operative to:
generate a reduced table of the one or more nodes remaining in the binary decision tree based on the mask;
select one of the one or more nodes in the reduced table as a terminal node based on a likelihood ratio; and
reassign the new terminal node to be a set of zero.

18. The system of claim 17, wherein the Bayesian module is operative to:
shift the mask in a circular pattern to re-use the prioritized and selected nodes as a new set of prioritized nodes to be evaluated.

19. A non-transitory computer-readable medium storing program code, the program code executable by a computer system to cause the computer system to, via a Bayesian module:
generate a binary decision tree representing a chain in a simulation, wherein the chain includes one or more nodes;
rank the one or more nodes based on a probability of retention to prioritize which nodes in the binary decision tree to simulate;
execute each of the one or more prioritized nodes in the binary decision tree in parallel to determine a posterior probability for each prioritized node; and
determine whether each prioritized node is accepted or rejected based on the posterior probabilities.

20. The medium of claim 19, wherein the program code executable by the computer system further causes the computer system to:
select the prioritized nodes to execute in a first round of execution, wherein the selected prioritized nodes are nodes likely to be in the chain.

21. The medium of claim 20, wherein the program code executable by the computer system further causes the computer system to:
generate a table including data associated with the selected prioritized nodes, wherein the table is representative of the prioritized and selected nodes.

22. The medium of claim 21, wherein the program code executable by the computer system further causes the computer system to:
determine if a convergence criteria has been met.

23. The medium of claim 22, wherein the program code executable by the computer system further causes the computer system to:
shift the table in a circular pattern to re-use the prioritized and selected nodes as a new set of nodes to be evaluated.

* * * * *